(12) United States Patent
Takamiya et al.

(10) Patent No.: US 12,156,341 B2
(45) Date of Patent: Nov. 26, 2024

(54) FEEDER STATE DISPLAY SYSTEM

(71) Applicant: FUJI CORPORATION, Chiryu (JP)

(72) Inventors: Hideyasu Takamiya, Chiryu (JP); Shinji Naito, Anjo (JP)

(73) Assignee: FUJI CORPORATION, Chiryu (JP)

( * ) Notice: Subject to any disclaimer, the term of this patent is extended or adjusted under 35 U.S.C. 154(b) by 706 days.

(21) Appl. No.: 17/429,131

(22) PCT Filed: Feb. 13, 2019

(86) PCT No.: PCT/JP2019/005086
§ 371 (c)(1),
(2) Date: Aug. 6, 2021

(87) PCT Pub. No.: WO2020/165972
PCT Pub. Date: Aug. 20, 2020

(65) Prior Publication Data
US 2022/0053676 A1  Feb. 17, 2022

(51) Int. Cl.
H05K 13/08 (2006.01)
B65G 1/06 (2006.01)
G05B 19/4155 (2006.01)

(52) U.S. Cl.
CPC ............ *H05K 13/086* (2018.08); *B65G 1/06* (2013.01); *G05B 19/4155* (2013.01); *G05B 2219/50384* (2013.01)

(58) Field of Classification Search
CPC ...... G05B 19/4155; G05B 2219/50384; H05K 13/086; H05K 13/021; H05K 13/0419; B65G 1/06
See application file for complete search history.

(56) References Cited

U.S. PATENT DOCUMENTS 6,694,606 B1 * 2/2004 Ohashi ............... H05K 13/0215
242/558
7,010,389 B2 * 3/2006 Lunak .................. G06Q 10/087
700/242

(Continued)

FOREIGN PATENT DOCUMENTS

CN    108377639 A    8/2018
JP    2005-347351 A   12/2005

(Continued)

OTHER PUBLICATIONS

International Search Report issued on May 7, 2019 in PCT/JP2019/005086 filed on Feb. 13, 2019, 2 pages.

Primary Examiner — Nicholas Klicos
(74) Attorney, Agent, or Firm — Oblon, McClelland, Maier & Neustadt, L.L.P.

(57) ABSTRACT

A system includes feeder storage that stores feeders to be replenished to multiple component mounters and feeders removed from each component mounter, automatic exchanging device to replenish a feeder taken from the feeder storage to each component mounter and collect a feeder removed from each component mounter to the feeder storage, and feeder management section that manages whether each feeder stored in the feeder storage is a feeder to be replenished or a feeder to be collected. State display section, being provided with each feeder on an end face part on a removal direction side or an upper end face part, is configured to display a state of the feeder, and the feeder management section displays whether each feeder stored in the feeder storage is the feeder to be replenished or the feeder to be collected, on the state display section of each feeder.

5 Claims, 6 Drawing Sheets

(56) References Cited

U.S. PATENT DOCUMENTS

| | | | |
|---|---|---|---|
| 2011/0175750 A1* | 7/2011 | Anderson | H02J 3/00 340/870.16 |
| 2015/0052745 A1* | 2/2015 | Kurata | H05K 13/086 29/832 |
| 2015/0083845 A1* | 3/2015 | Kawaguchi | H05K 13/0419 242/563 |
| 2015/0212519 A1* | 7/2015 | Sumi | H05K 13/0215 700/115 |
| 2018/0220560 A1 | 8/2018 | Otsuka et al. | |
| 2019/0313557 A1* | 10/2019 | Matsushita | H05K 13/082 |
| 2020/0344926 A1* | 10/2020 | Higashino | H05K 13/0417 |
| 2020/0401974 A1* | 12/2020 | Matsushita | G05B 19/4155 |
| 2020/0404818 A1* | 12/2020 | Matsushita | H05K 13/0417 |

FOREIGN PATENT DOCUMENTS

| | | |
|---|---|---|
| JP | 2012-033688 A | 2/2012 |
| JP | 2012-134331 A | 7/2012 |
| WO | WO2017/033268 A1 | 3/2017 |
| WO | WO 2017/141365 A1 | 8/2017 |
| WO | WO 2018/008148 A1 | 1/2018 |

* cited by examiner

FEEDER STATE DISPLAY SYSTEM

TECHNICAL FIELD

The present specification discloses a technique related to a feeder state display system applied to a component mounting line including an automatic exchanging device that automatically exchanges feeders with respect to multiple component mounters arranged along a conveyance path of a circuit board.

BACKGROUND ART

In recent years, as described in Patent Literature 1 (international publication No. WO2017/141365), a component mounting line in which a feeder storage that temporarily stores feeders to be set in multiple component mounters constituting the component mounting line and feeders that removed from each component mounter is disposed on an upstream side of the component mounting line, and an automatic exchanging device moves over the feeder storage and the multiple component mounters such that the automatic exchanging device takes out a feeder from the feeder storage and sets the feeder in a feeder setting section of any of the component mounters, and also collects feeders removed from each component mounter in the feeder storage is provided.

PATENT LITERATURE

Patent Literature 1: International Publication No. WO2017/141365

BRIEF SUMMARY

Technical Problem

Incidentally, although the feeder to be replenished to the component mounter and the feeder to be collected are mixed in the feeder storage, there is little difference in appearance for distinguishing between the feeder to be replenished to the component mounter and the feeder to be collected. Therefore, when an operator selects and collects the feeder to be collected visually from a large number of feeders stored in the feeder storage, the feeder to be replenished to the component mounter may be incorrectly determined to be the feeder to be collected and taken out, so that it is difficult for the operator to accurately and efficiently perform a collecting operation of the feeder from the feeder storage.

Solution to Problem

In order to solve the above problems, a feeder state display system applied to a component mounting line including multiple component mounters arranged along a conveyance path of a circuit board, a feeder storage that temporarily stores feeders to be replenished to the multiple component mounters and feeders removed from each component mounter, and an automatic exchanging device that moves over the feeder storage and the multiple component mounters to replenish a feeder taken out from the feeder storage to each component mounter and collect a feeder removed from each component mounter to the feeder storage, includes a feeder management section configured to manage whether each feeder stored in the feeder storage is a feeder to be replenished to the component mounter or a feeder to be collected, and a state display section, being provided with each feeder on an end face part on a removal direction side or an upper end face part, which is configured to display a state of the feeder, in which the feeder management section displays whether each feeder stored in the feeder storage is the "feeder to be replenished" or the "feeder to be collected", on the state display section of each feeder.

In this configuration, since whether the "feeder to be replenished" or the "feeder to be collected" is displayed on the state display section provided on the end face part on the removal direction side or the upper end face part that is a position easily viewable from the operator side of each feeder stored in the feeder storage, when the operator selects and collects the "feeder to be collected" from the large number of feeders stored in the feeder storage, the operator can easily determine visually whether the feeder is the "feeder to be replenished" or the "feeder to be collected" by viewing the display on the state display section of each feeder stored in the feeder storage. As a result, the operator can accurately and efficiently perform a collecting operation of the feeder from the feeder storage.

DESCRIPTION OF EMBODIMENTS

Hereinafter, an embodiment disclosed in the present specification will be described. First, a configuration of component mounting line 10 will be described with reference to FIGS. 1 to 3.

Component mounting line 10 is configured by arranging multiple component mounters 12 along a conveyance direction (X-direction) of circuit board 11, and a solder printer (not shown) that prints solder on circuit board 11, feeder storage 19 that temporarily stores cassette-type feeder 14, or the like are installed on an upstream side (board carry-in side) of component mounting line 10.

Figure 1:
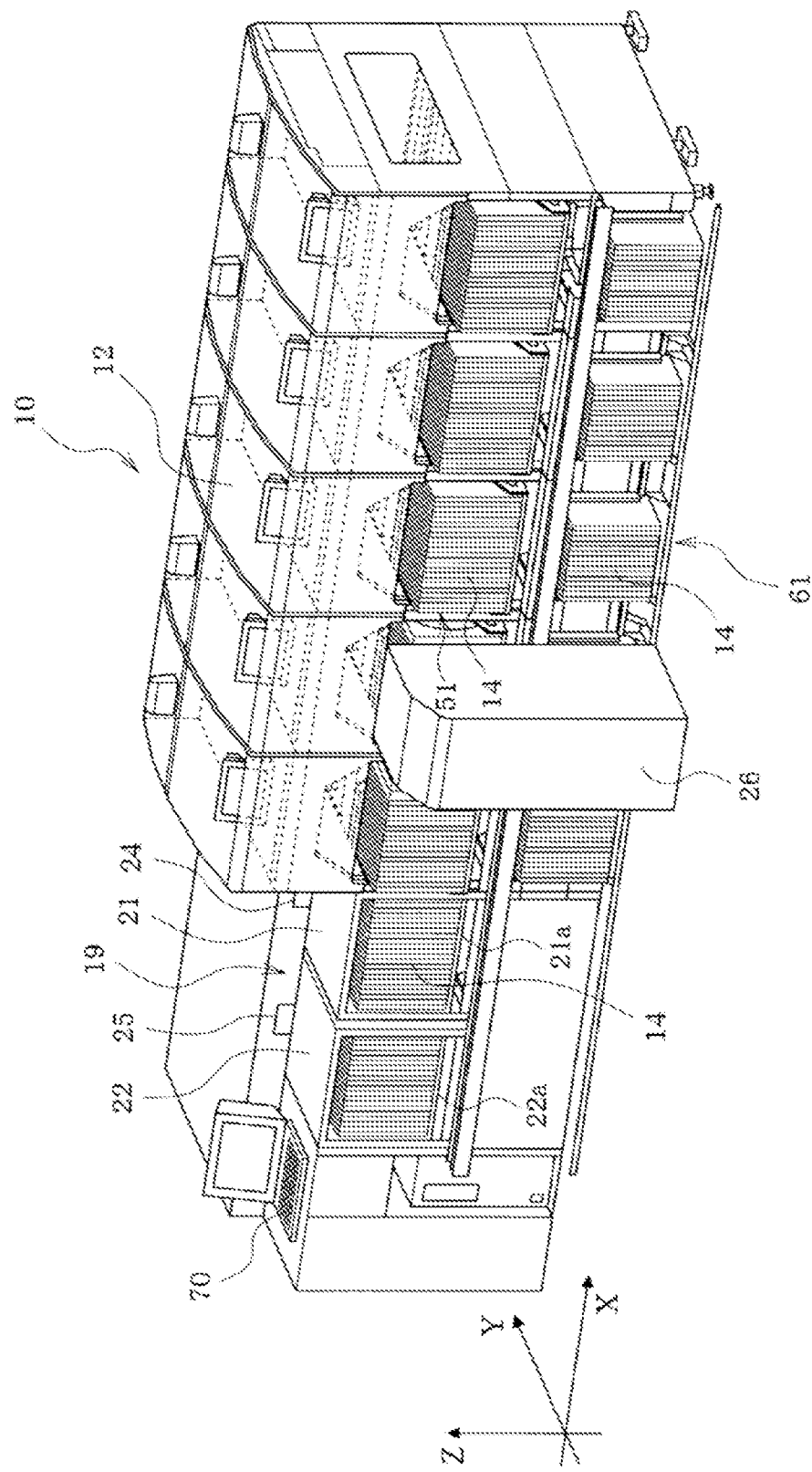
FIG. 1 is a perspective view showing an entire configuration of a component mounting line of an embodiment.
Figure 2:
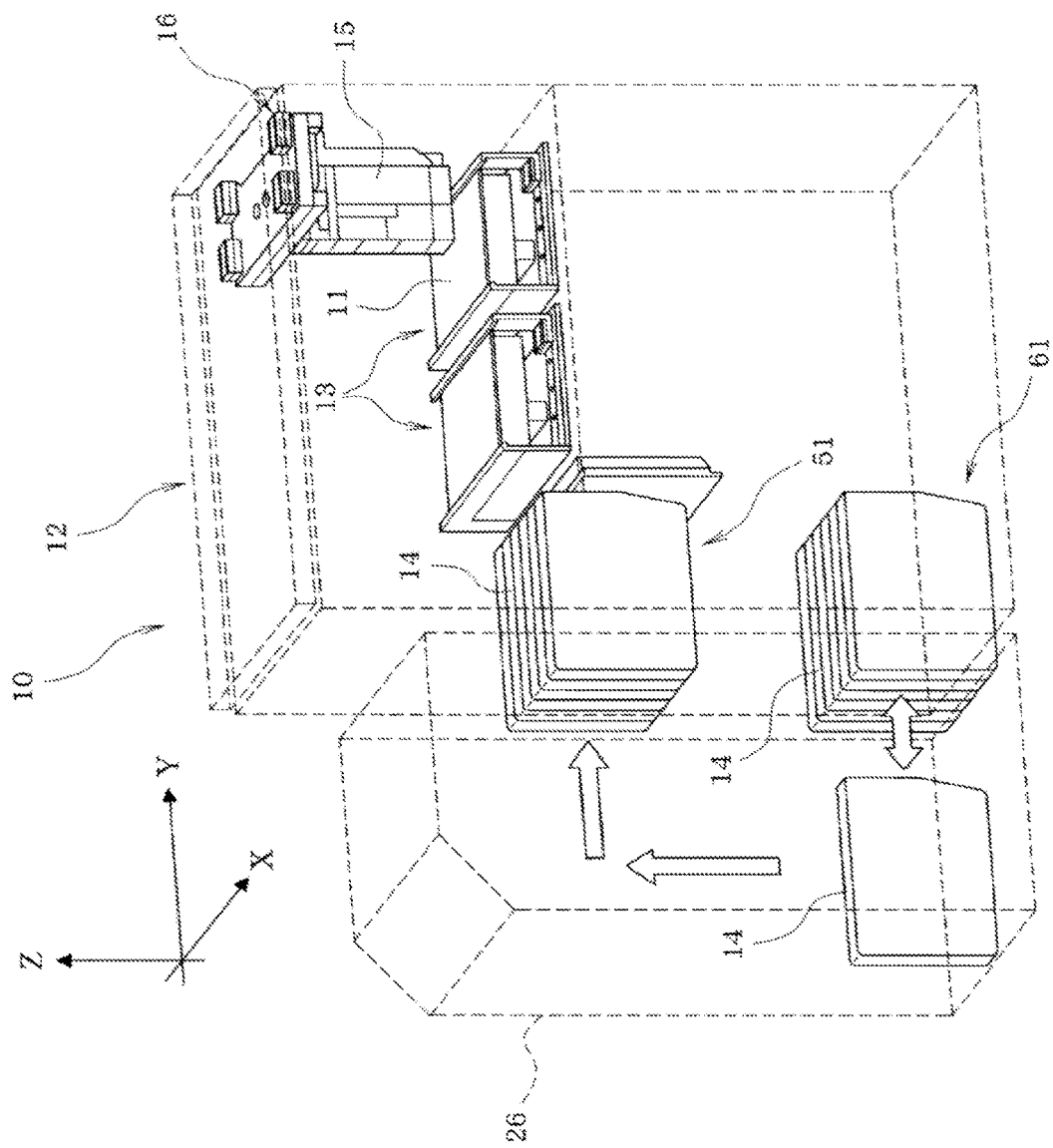
FIG. 2 is a perspective view schematically showing a configuration of an automatic exchanging device and a component mounter.

As illustrated in FIG. 2, each component mounter 12 is provided with two conveyors 13 that conveys a circuit board, mounting head 15 that exchangeably holds a suction nozzle (not shown) that picks up components supplied from feeder 14 and mounts the components on circuit board 11, head moving device 16 that moves mounting head 15 in an XY-directions (left, right, forward, and rearward directions), display device 23 (see FIG. 1), such as a liquid crystal display, CRT, and the like.

Each component mounter 12 of component mounting line 10 conveys circuit board 11 conveyed from component mounter 12 on an upstream side to a predetermined position with conveyor 13, clamps circuit board 11 with a clamping mechanism (not shown), picks up the component supplied from feeder 14 with the suction nozzle of mounting head 15, moves the component from a pickup position to an imaging position, images the component from a lower face side with a component imaging camera (not shown), and determines a pickup positional deviation amount of the component, and then moves mounting head 15 to above circuit board 11 to correct the pickup positional deviation amount of the component and mounts the component on circuit board 11 to produce a component mounting board.

As shown in FIG. 1, automatic exchanging device 26 that performs automatic exchange (set and/or removal) of feeder 14 to feeder setting section 51 of each of multiple component mounters 12 is disposed on a front face side of component mounting line 10 such that automatic exchanging device 26 moves over feeder storage 19 and multiple component mounters 12. Below feeder setting section 51 of each component mounter 12, stock section 61 that temporarily houses feeder 14 to be automatically exchanged with respect to feeder setting section 51 of each component mounter 12 is provided. Automatic exchanging device 26 sets feeder 14 taken out from feeder storage 19 in feeder setting section 51 or stock section 61 of any component mounter 12, sets feeder 14 taken out from stock section 61 of any component mounter 12 in feeder setting section 51 of component mounter 12, collects feeder 14 removed from feeder setting section 51 of any component mounter 12 in stock section 61 of component mounter 12, or collects feeder 14 removed from feeder setting section 51 or stock section 61 of any component mounter 12 in feeder storage 19.

In the present embodiment, feeder storage 19 is divided into feeder storage section for replenishment 21 that stores feeder 14 to be replenished to feeder setting section 51 or stock section 61 of component mounter 12, and feeder storage section for collection 22 that stores feeder 14 collected from feeder setting section 51 or stock section 61 of component mounter 12. Each of feeder storage sections 21 and 22 may be configured by one feeder storage or may be configured by multiple feeder storages. Alternatively, a feeder placement area of one feeder storage may be partitioned into the feeder storage section for replenishment and the feeder storage section for collection for operation.

Figure 6:
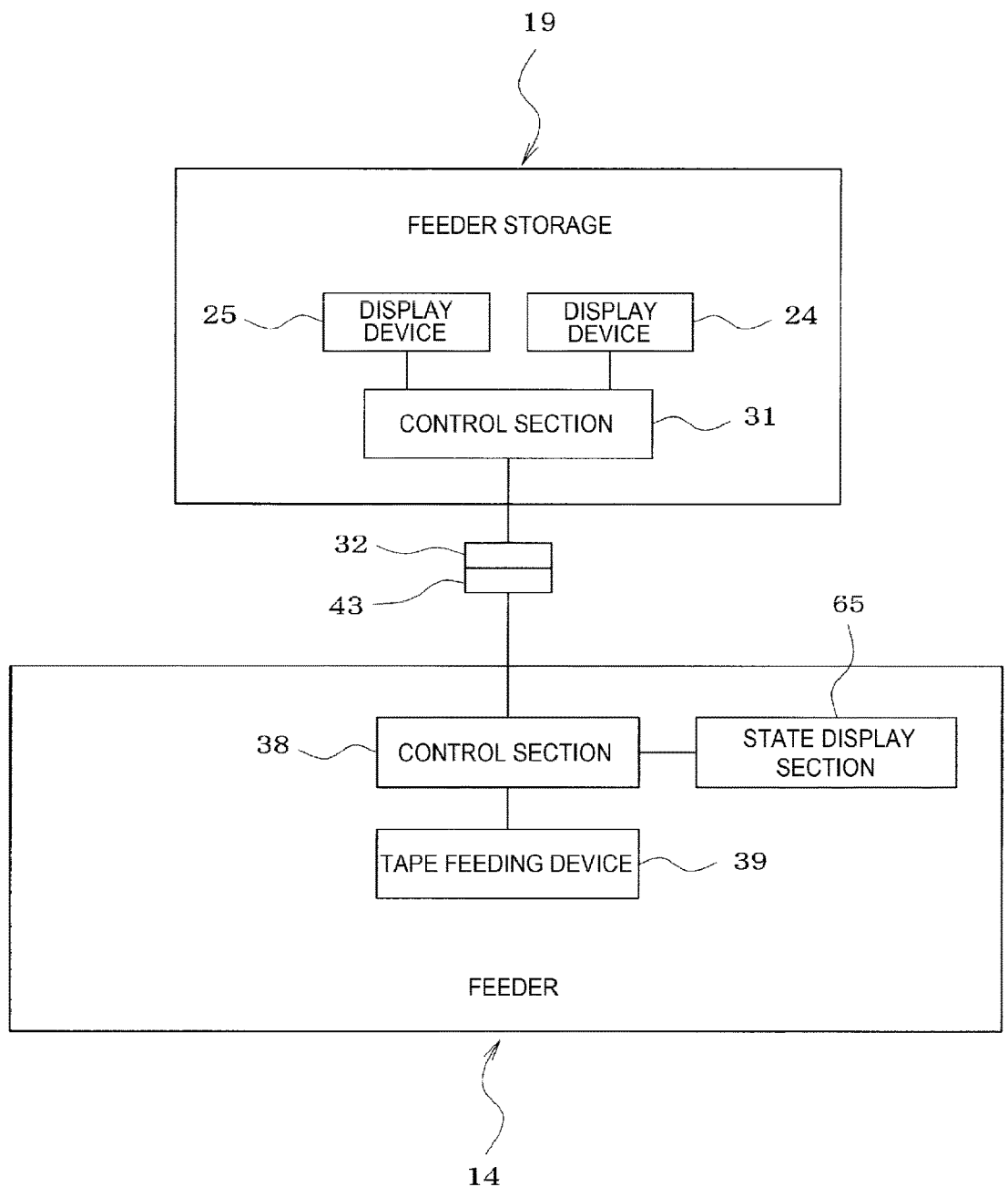
FIG. 6 is a block diagram showing an electrical connection relationship between a feeder stored in a feeder storage and the feeder storage.

Similar to feeder setting section 51 of component mounter 12, each of feeder storage sections 21 and 22 of feeder storage 19 is provided with multiple slots (not shown) for setting multiple feeders 14, and each slot is provided with connector 32 (see FIG. 6) for power supply and communication. As for each feeder 14 stored in feeder storage 19, connector 43 (see FIGS. 4 and 6) provided on an end face part on an attachment direction side is inserted and connected to connector 32 of feeder storage 19, so that power is supplied from feeder storage 19 side to various electric components such as control section 38, tape feeding device 39, or the like in each feeder 14. As a result, control section 31 (see FIG. 6) of feeder storage 19 communicates with control section 38 of each feeder 14, acquires identification information (feeder ID) of each feeder 14, recognizes a type of each feeder 14 and a position (slot number) of the slot in which each feeder 14 is set, and transmits information to production management computer 70 described later.

Further, in the present embodiment, as shown in FIG. 1, pallets 21a and 22a on which feeders 14 to be stored in respective feeder storage sections 21 and 22 are placed are detachably set in respective feeder storage sections 21 and 22 of feeder storage 19, and multiple feeders 14 to be stored in respective feeder storage sections 21 and 22 are collectively attached and detached with pallets 21a and 22a. Feeder storage sections 21 and 22 are provided with display devices 24 and 25 that display whether feeder storage sections 21 and 22 are for replenishment or collection, respectively.

Figure 4:
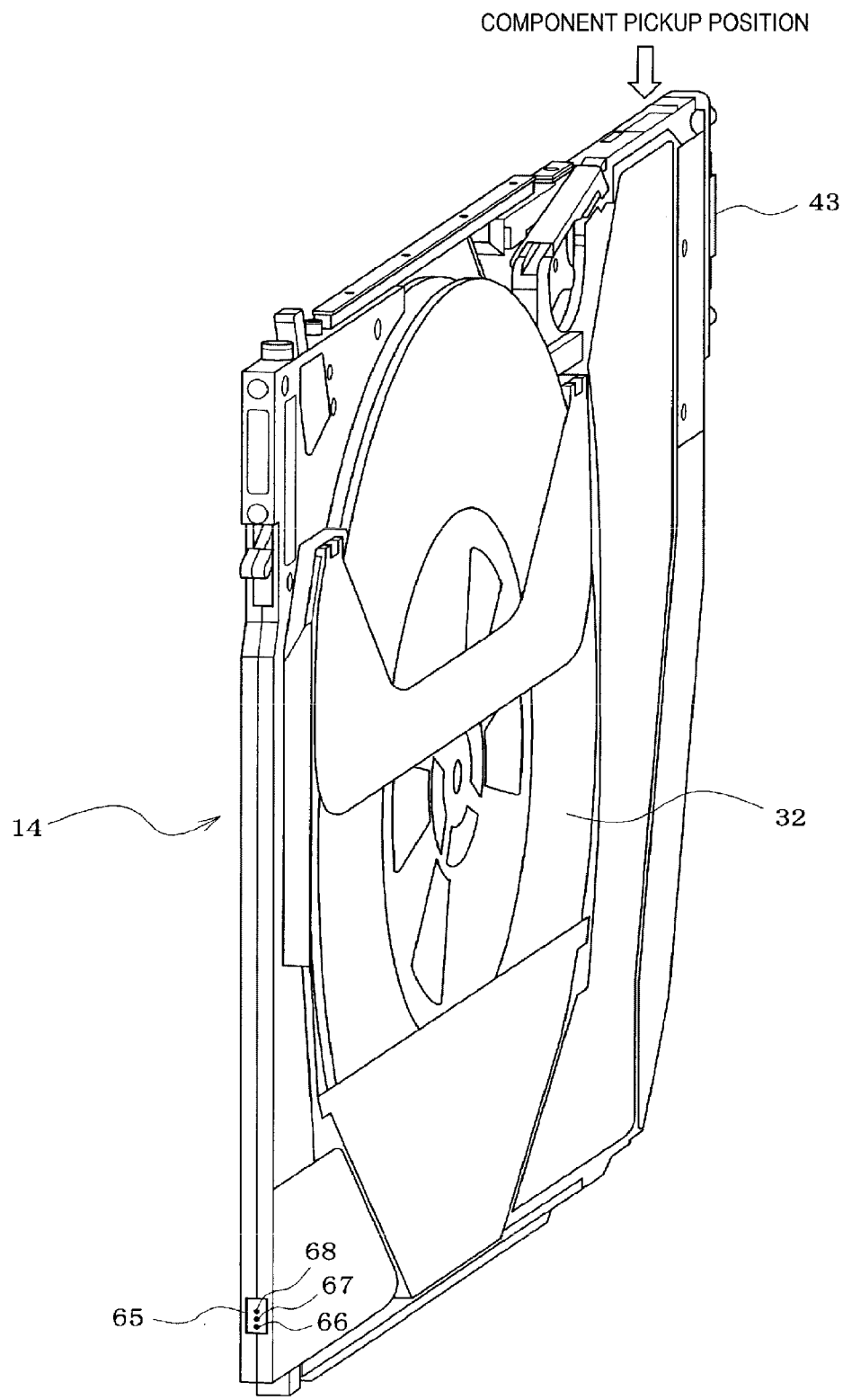
FIG. 4 is a perspective view of a feeder as viewed from an oblique direction on a removal direction side.
Figure 5:
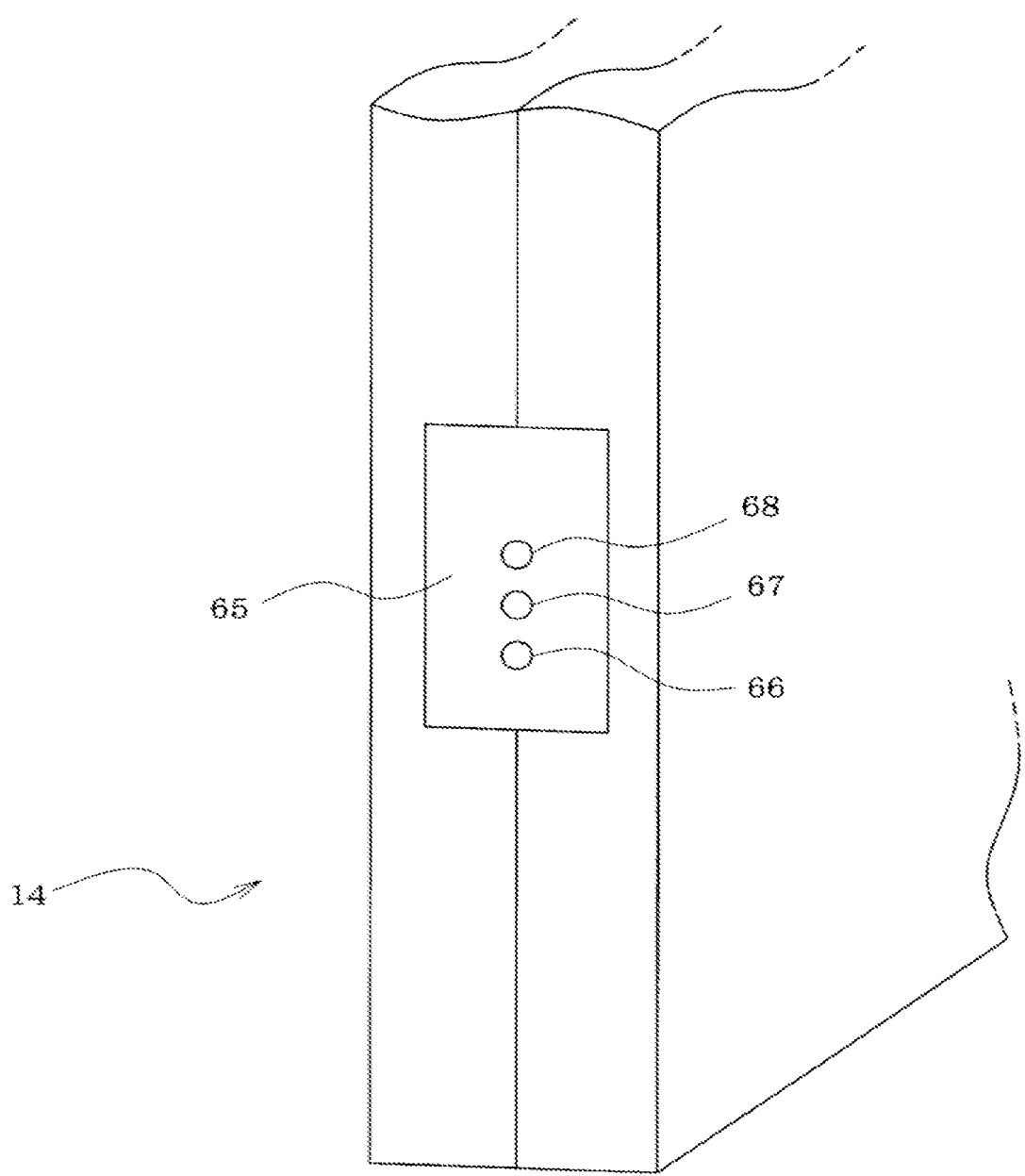
FIG. 5 is an enlarged perspective view of a state display section provided on an end face part on the removal direction side of the feeder.

As shown in FIG. 4, state display section 65 that displays a state of feeder 14 set in feeder setting section 51 of component mounter 12 is provided on an end face part on a removal direction side of feeder 14. In the present embodiment, as shown in FIG. 5, state display section 65 is configured by arranging multiple light emitting elements 66, 67, and 68, such as three LEDs having different light emitting colors, in a row vertically.

In the present embodiment, light emitting element 66 at the lowermost position has a green light emitting color, and light emitting element 66 emits green light (turn on) when the power is supplied to feeder 14, thereby displaying that the power is being supplied. Light emitting element 67 at the intermediate position has a yellow light emitting color, and light emitting element 67 at the intermediate position blinks yellow light when the number of remaining components of component supply tape wound on tape reel 32 is equal to or less than a predetermined value, thereby displaying that the number of remaining components is equal to or less than the predetermined value (close to component shortage). Further, light emitting element 67 at the intermediate position emits yellow light (turn on) at the time of component shortage, thereby displaying the component shortage. Light emitting element 68 at the uppermost position has a red light emitting color, and light emitting element 68 at the uppermost position emits red light (turn on) when an error stop is caused by malfunction in a component supplying operation (tape feeding operation) of feeder 14, thereby displaying the malfunction in a component supplying operation of feeder 14. In addition, when it is determined that a maintenance of feeder 14 is necessary based on an occurrence rate of the component pickup error or the like during the production, light emitting element 68 at the uppermost position blinks in red, thereby displaying that the maintenance of feeder 14 is necessary.

In addition, state display section 65 of each feeder 14 stored in each of feeder storage sections 21 and 22 of feeder storage 19 displays whether each feeder 14 is feeder 14 to be replenished to feeder setting section 51 or stock section 61 of component mounter 12, or feeder 14 to be collected, with different light emitting colors or different light emitting patterns. State display section 65 of feeder 14 to be replenished displays that "feeder 14 is to be replenished", for example, by causing green-light emitting element 66 to emit light (turn on) or blink. State display section 65 of feeder 14 to be collected displays that "feeder 14 is to be collected", for example, by causing yellow-light emitting element 67 to emit light (turn on) or blink.

Figure 3:
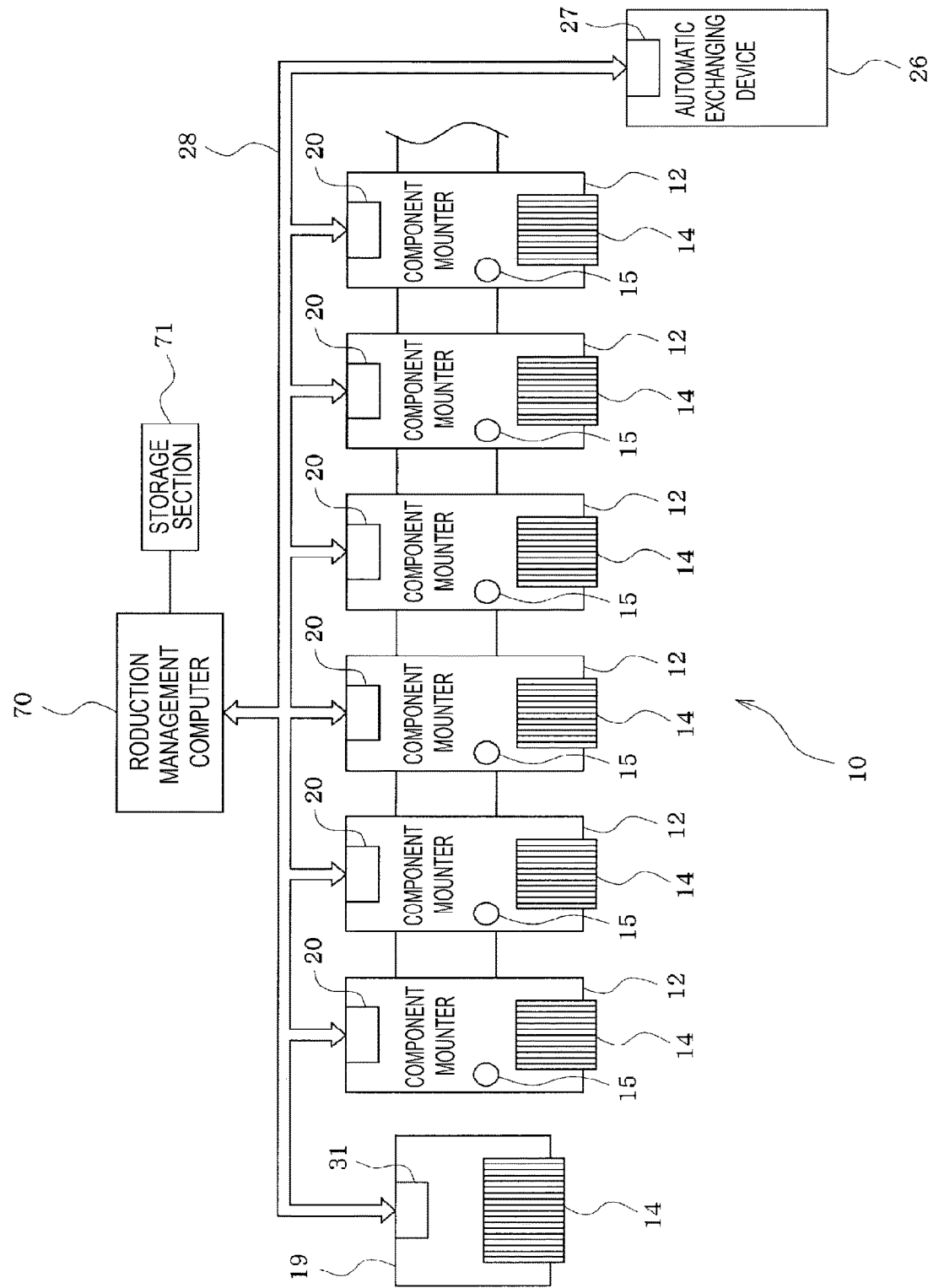
FIG. 3 is a block diagram schematically showing a configuration of the component mounting line with the automatic exchanging device.

As shown in FIG. 3, control section 20 of each component mounter 12 of component mounting line 10, control section 31 of feeder storage 19, and control section 27 of automatic exchanging device 26 are communicably connected to production management computer 70 that manages the entire component mounting line 10 via network 28, such as a wired LAN or a wireless LAN, and an operation of each component mounter 12 of component mounting line 10 and an operation of automatic exchanging device 26 are managed by production management computer 70.

Production management computer 70 communicates with control section 20 of each component mounter 12 and control section 31 of feeder storage 19 via network 28 to acquire identification information (hereinafter, referred to as a "feeder ID") of each feeder 14 set in each component mounter 12 and feeder storage 19, and manages the production of component mounting line 10. Further, production management computer 70 functions as a feeder management section, monitors the number of remaining components and/or the component shortage of each feeder 14 set in each component mounter 12, stores information on the number of remaining components and/or the component shortage of each feeder 14 to storage section 71 in association with the feeder ID, determines whether each feeder 14 stored in feeder storage 19 is "feeder 14 to be replenished" or "feeder 14 to be collected" based on the feeder ID of each feeder 14 stored in feeder storage 19, storage data in storage section 71, and a production job, and displays a result of the determination on state display section 65 of each feeder 14. For example, in a case where feeder 14 stored in feeder storage 19 is determined to be feeder 14 in the component shortage state (or having small number of remaining components) based on the storage data in storage section 71, production management computer 70 displays that "feeder 14 is to be collected" on state display section 65 of feeder 14. In addition, in a case where feeder 14 stored in feeder storage 19 is determined to be feeder 14 not to be used for the production based on the production job, production management computer 70 displays that "feeder 14 is to be collected" on state display section 65 of feeder 14. In addition, in a case where feeder 14 stored in feeder storage 19 is determined not to be feeder 14 in the component shortage state (or having small number of remaining components) and to be used for the production based on the storage data in storage section 71 and the production job, production management computer 70 displays that "feeder 14 is to be replenished" on state display section 65 of feeder 14.

In addition, production management computer 70 determines whether there is misplaced feeder 14 among feeders 14 stored in feeder storage section for replenishment 21 and feeder storage section for collection 22 of feeder storage 19, and in a case where there is misplaced feeder 14, causes state display section 65 of feeder 14 to display the fact that feeder 14 is misplaced. That is, in a case where feeder 14 to be collected is misplaced in feeder storage section for replenishment 21, or in a case where feeder 14 to be replenished is misplaced in feeder storage section for collection 22, state display section 65 of feeder 14 displays that feeder 14 is misplaced. The misplacement of feeder 14 is displayed, for example, by causing red-light emitting element 68 to emit light or blink, such that "feeder 14 is misplaced" is displayed.

Further, in a case where feeder 14 is misplaced in feeder storage section for replenishment 21 and feeder storage section for collection 22 of feeder storage 19, production management computer 70 displays that feeder 14 is misplaced, on display device 24 or 25 of feeder storage section 21 or 22 where feeder 14 is misplaced.

In the present embodiment, since whether "feeder 14 to be replenished" or "feeder 14 to be collected" is displayed on state display section 65 provided on the end face part on the removal direction side that is a position easily viewable from the operator side of each feeder 14 stored in feeder storage 19, when the operator selects and collects "feeder 14 to be collected" from large number of feeders 14 stored in feeder storage 19, the operator can easily determine visually whether feeder 14 is "feeder 14 to be replenished" or "feeder 14 to be collected" by viewing the display on state display section 65 of each feeder 14 stored in feeder storage 19. As a result, the operator can accurately and efficiently perform a collecting operation of feeder 14 from feeder storage 19.

In addition, since feeder storage 19 of the present embodiment is divided into feeder storage section for replenishment 21 that stores feeder 14 to be replenished and feeder storage section for collection 22 that stores feeder 14 to be collected, a replenishing operation or a collecting operation of feeder 14 is performed efficiently compared with a case where feeder 14 to be replenished and feeder 14 to be collected are mixed irregularly.

Further, since pallets 21*a* and 22*a* on which feeders 14 to be stored in respective feeder storage sections 21 and 22 are placed are detachably set in respective feeder storage sections for replenishment/collection 21 and 22, and multiple feeders 14 to be stored in respective feeder storage sections 21 and 22 are collectively attached and detached with pallets 21*a* and 22*a,* the replenishing operation or the collecting operation of feeder 14 with respect to each of the feeder storage sections 21 and 22 can be performed more efficiently.

Further, since whether there is misplaced feeder 14 among feeders 14 stored in feeder storage sections for replenishment/collection 21 and 22 is determined, and in a case where there is misplaced feeder 14, state display section 65 of feeder 14 is caused to display the fact that feeder 14 is misplaced, the operator can easily found the misplacement of feeder 14 and switch misplaced feeder 14.

In the present embodiment, feeder storage 19 is divided into feeder storage section for replenishment 21 and feeder storage section for collection 22, but this division may be omitted and "feeder 14 to be replenished" and "feeder 14 to be collected" are mixed in feeder storage 19 irregularly. Even in this case, since whether "feeder 14 to be replenished" or "feeder 14 to be collected" is displayed on state display section 65 of each feeder 14 stored in feeder storage 19, the operator can easily determine visually whether "feeder 14 to be replenished" or "feeder 14 to be collected".

In addition, in the present embodiment, state display section 65 is provided on the end face part on the removal direction side of feeder 14, but in a case where an upper end face part of feeder 14 is exposed when viewed from the operator side in a state where feeder 14 is mounted on feeder storage 19, state display section 65 may be provided on the upper end face part of feeder 14, in other words, state display section 65 may be provided at a position of feeder 14 that is easily viewable from the operator side in a state where feeder 14 is mounted on feeder storage 19.

Further, the configuration of state display section 65 is also not limited to the present embodiment, and the light emitting colors, the number, and the arrangement of the light emitting elements may be changed. Alternatively, the state display section may be configured by a digital display or the like, and display the state of feeder 14 by characters or symbols, such as numerals or alphabetic characters. In this case, relationships between the state of feeder 14 and the characters or symbols, such as numerals or alphabetic characters, may be defined in advance.

In addition, the display of the state of feeder 14 and the display of the replenishment/collection of feeder 14 may be simultaneously displayed on state display section 65 of each feeder 14 stored in feeder storage 19. This can be achieved by making the display of the state of feeder 14 and the display of the replenishment/collection of feeder 14 different from each other.

In addition, feeder storage 19 is disposed on the upstream side of component mounting line 10 in the present embodiment, but feeder storage 19 may be disposed on a downstream side of component mounting line 10, or may be disposed at a position between any component mounters 12 among multiple component mounters 12 constituting component mounting line 10.

It is needless to say that the present disclosure is not limited to the present embodiment and can be implemented by various modifications within a range not departing from the gist, for example, changing the configuration of component mounting line 10, changing an attachment structure of feeder 14 with respect to feeder setting section 51 of component mounter 12, or changing the configuration of feeder 14.

REFERENCE SIGNS LIST

10 . . . component mounting line, 11 . . . circuit board, 12 . . . component mounter, 14 . . . feeder, 15 . . . mounting head, 19 . . . feeder storage, 20 . . . control section of component mounter, 21 . . . feeder storage section for replenishment, 22 . . . feeder storage section for collection, 24 and 25 . . . display device, 38 . . . control section of feeder, 51 . . . feeder setting section, 61 . . . stock section, 65 . . . state display section, 66, 67, and 68 . . . light emitting element, 70 . . . production management computer (feeder management section), 71 . . . storage section

The invention claimed is:

1. A feeder state display system applied to
a component mounting line including:
multiple component mounters arranged along a conveyance path of a circuit board;
a feeder storage that temporarily stores feeders to be replenished to the multiple component mounters and feeders removed from each component mounter; and
an automatic exchanging device that moves over the feeder storage and the multiple component mounters to replenish a feeder taken out from the feeder storage to each component mounter and collect a feeder removed from each component mounter to the feeder storage,
the feeder state display system comprising:
a feeder management section configured to manage whether each feeder stored in the feeder storage is a feeder to be replenished to the component mounter or a feeder to be collected; and
a state display section, being provided with each feeder on an end face part on a removal direction side or an upper end face part, which is configured to display a state of the feeder, wherein
the feeder management section displays whether each feeder stored in the feeder storage is the feeder to be replenished or the feeder to be collected. on the state display section of each feeder, the feeder storage is divided into a feeder storage section for replenishment, which stores the feeder to be replenished, and a feeder storage section for collection, which stores the feeder to be collected, and
in a case where an operator places the feeder to be replenished into the feeder storage section for collection, the feeder management section displays that the feeder is misplaced. on the state display section of the feeder.

2. The feeder state display system according to claim 1, wherein the feeder management section is a production management computer communicably connected to the multiple component mounters, the feeder storage, and the automatic exchanging device, and
the production management computer is configured to manage a production of the component mounting line by communicating with the multiple component mounters and the feeder storage to acquire identification information of each feeder set in the multiple component mounters and the feeder storage, monitor a number of remaining components and/or component shortage of each feeder set in the multiple component mounters, and store information on the number of remaining components and/or the component shortage of each feeder to a storage section in association with the identification information, and further, determine whether each feeder stored in the feeder storage is the feeder to be replenished or the feeder to be collected based on the identification information of each feeder stored in the feeder storage, storage data in the storage section, and a production job, and display a result of the determination on the state display section of each feeder.

3. The feeder state display system according to claim 1, wherein pallets on which the feeders to be stored in the respective feeder storage sections are placed are detachably set in the feeder storage section for replenishment and the feeder storage section for collection, and multiple feeders to be stored in the respective feeder storage sections are collectively attached and detached with the pallets.

4. The feeder state display system according to claim 1, wherein a display device that displays whether each feeder storage section is for replenishment or collection is provided in each of the feeder storage section for replenishment and the feeder storage section for collection.

5. The feeder state display system according to claim 4, wherein in a case where a feeder is misplaced in the feeder storage section for replenishment and the feeder storage section for collection, the feeder management section displays that the feeder is misplaced, on the display device of the feeder storage section where the feeder is misplaced.

\* \* \* \* \*